United States Patent
Swaminathan

(10) Patent No.: US 9,190,132 B2
(45) Date of Patent: Nov. 17, 2015

(54) REDUCING SIGNAL SKEW IN MEMORY AND OTHER DEVICES

(71) Applicant: Broadcom Corporation, Irvine, CA (US)

(72) Inventor: Ganesh Swaminathan, Bangalore (IN)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/676,482

(22) Filed: Nov. 14, 2012

(65) Prior Publication Data

US 2014/0133260 A1 May 15, 2014

(51) Int. Cl.
G11C 7/22 (2006.01)
G11C 8/18 (2006.01)
G11C 5/06 (2006.01)

(52) U.S. Cl.
CPC ...... *G11C 8/18* (2013.01); *G11C 5/063* (2013.01); *G11C 7/22* (2013.01); *G11C 7/222* (2013.01)

(58) Field of Classification Search
CPC ............. G11C 7/22; G11C 7/222; G11C 8/18
USPC .................................. 365/194, 198; 327/144
See application file for complete search history.

(56) References Cited

U.S. PATENT DOCUMENTS

| | | | |
|---|---|---|---|
| 5,239,215 A | 8/1993 | Yamaguchi | |
| 6,088,254 A * | 7/2000 | Kermani | 365/63 |
| 8,253,437 B2 | 8/2012 | Garg et al. | |
| 2004/0008730 A1 * | 1/2004 | Helzer | 370/505 |
| 2004/0260523 A1 * | 12/2004 | Yang et al. | 703/2 |
| 2005/0135184 A1 * | 6/2005 | Forbes | 365/233 |
| 2005/0259504 A1 * | 11/2005 | Murtugh et al. | 365/233 |
| 2006/0044891 A1 * | 3/2006 | Lin et al. | 365/193 |
| 2007/0063728 A1 * | 3/2007 | Briet et al. | 326/14 |
| 2009/0154211 A1 * | 6/2009 | Qu et al. | 365/51 |

* cited by examiner

*Primary Examiner* — Hoai V Ho
*Assistant Examiner* — Jay Radke
(74) *Attorney, Agent, or Firm* — Brinks Gilson & Lione

(57) ABSTRACT

Interconnections between signal lines help to reduce signal skew between signals carried on the signal lines. The interconnections may be resistive interconnections, and the signal lines may be clock lines. In a memory controller, for example, resistive traces may connect adjacent clock lines. The resistive traces reduce the clock signal skew between the adjacent clock lines, and throughout the memory controller as a whole.

20 Claims, 4 Drawing Sheets

REDUCING SIGNAL SKEW IN MEMORY AND OTHER DEVICES

TECHNICAL FIELD

This disclosure relates to electrical signals. In particular, this disclosure relates to reducing skew between electrical signals, such as clock signals.

BACKGROUND

Rapid advances in electronics and communication technologies, driven by immense customer demand, have resulted in the widespread adoption of a vast array of electronic devices. As just a few examples, the devices include smart phones, high performance computer systems, navigation devices, and music players. Regardless of the device, one common goal is to increase processing speeds to accommodate increasingly sophisticated functionality. Continued improvement in electronic devices will help meet this goal, and others.

BRIEF DESCRIPTION OF THE DRAWINGS

The innovation may be better understood with reference to the following drawings and description. In the figures, like reference numerals designate corresponding parts throughout the different views.

DETAILED DESCRIPTION

Figure 1:
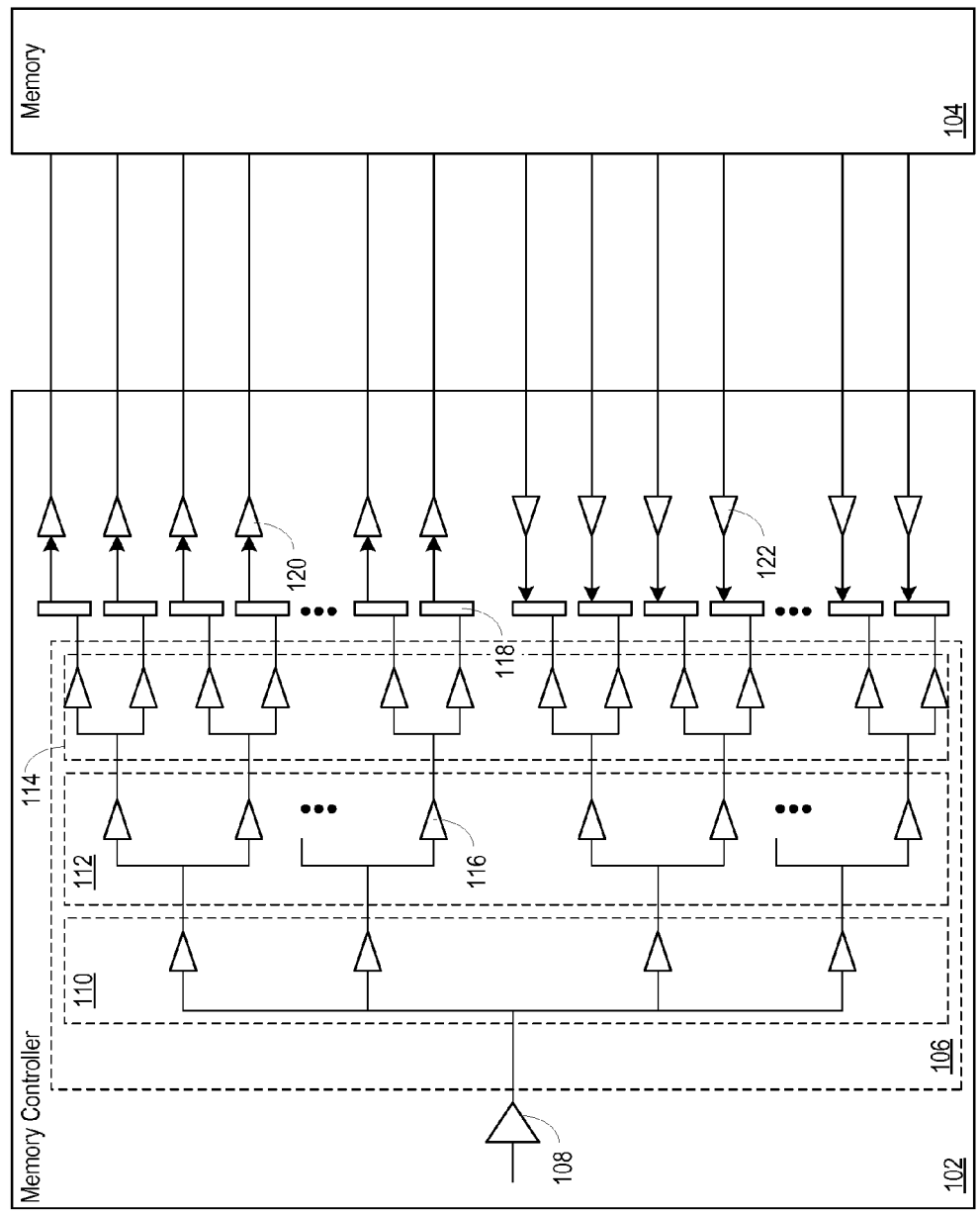
FIG. 1 shows an example of a memory controller and a memory.
Figure 2:
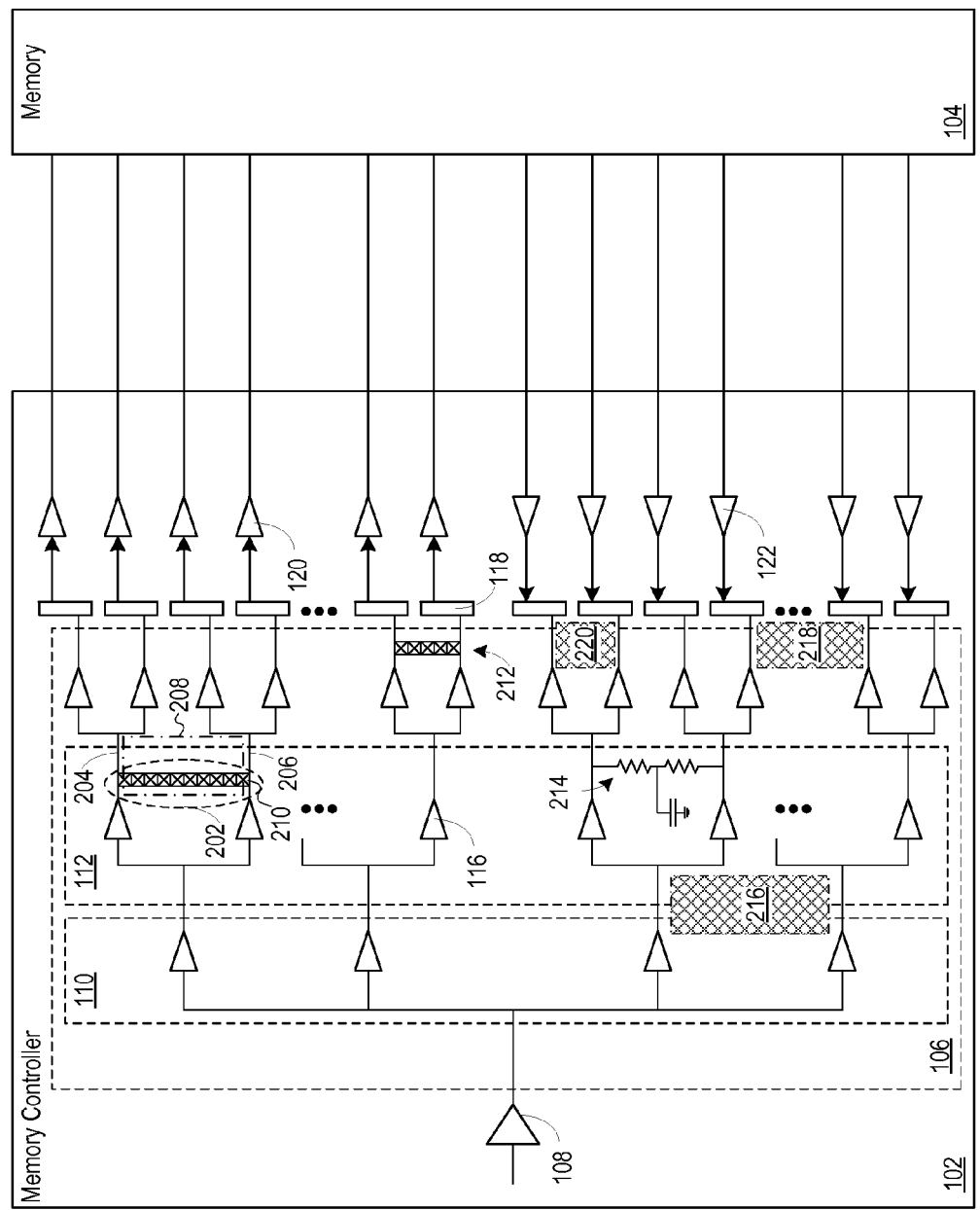
FIG. 2 is an example of a memory controller that includes skew control interconnects.

One specific example of skew control is given next in FIGS. 1 and 2 with regard to clock lines and memory controllers. Although some of the examples described below are in the context of memory architectures that include memory controllers that manage memories, the skew control techniques described below may be implemented in other systems and within other devices. For example, a global positioning device may implement the skew control techniques on various signals, regardless of whether those signals are clock, data, address, control, or other signals. The skew control will help the signals arrive at circuitry within the device closer in time to one another.

FIG. 1 shows an example of a memory architecture 100 that may be enhanced to include skew control. The memory architecture 100 includes a memory controller 102 that manages a memory 104. Within the memory controller 102 is a clock distribution tree 106. A clock source 108 drives the clock distribution tree 106 with a clock signal. The clock distribution tree 106 may implement, as an example, a hierarchical distribution of the clock signal through multiple branching levels, such as the first level 110, second level 112, and third level 114.

The clock distribution tree 106 may include any number of buffers (e.g., the buffer 116) or other logic to help drive the clock signal. The clock signals may be connected to any circuitry, such as registers or flip flops (e.g., the flip flop 118). In the context of the memory controller 102, the circuitry may drive signals out to the memory 104 (e.g., address, data, and control signals) and receive signals from the memory 104 (e.g., data signals). Output buffers (e.g., the output buffer 120) and input buffers (e.g., the input buffer 122) may also be present.

The clock distribution tree 106 provides widespread distribution of the clock signal to various logic sections within the memory controller 102 in a balanced manner. One goal of the balanced delivery is to make the clock signals arrive at the logic sections at the same time (e.g., with zero skew), regardless of where the logic is located in the memory controller 102.

However, skew is almost always present due to several factors. Among the factors are place-and-route (PnR) related issues. In any circuit layout, the placement of the logic sections, the length of traces running to and between the logic sections, and other placement and routing factors cause signals starting from a common point to arrive at their destinations at slightly different times. Furthermore, on chip variation in the fabrication of the logic sections, the traces, their compositions, sizes, and shapes, also introduces skew into signals travelling through the device. In addition, another important source of skew is the dynamic voltage fluctuations due to the switching of various logic elements in the chip. When signal skew is present, device operation may be slower, because the device must wait for signals to arrive before carrying out related processing, and before continuing on to the next operation. Thus, reduced skew can lead to faster device operation.

Figure 3:
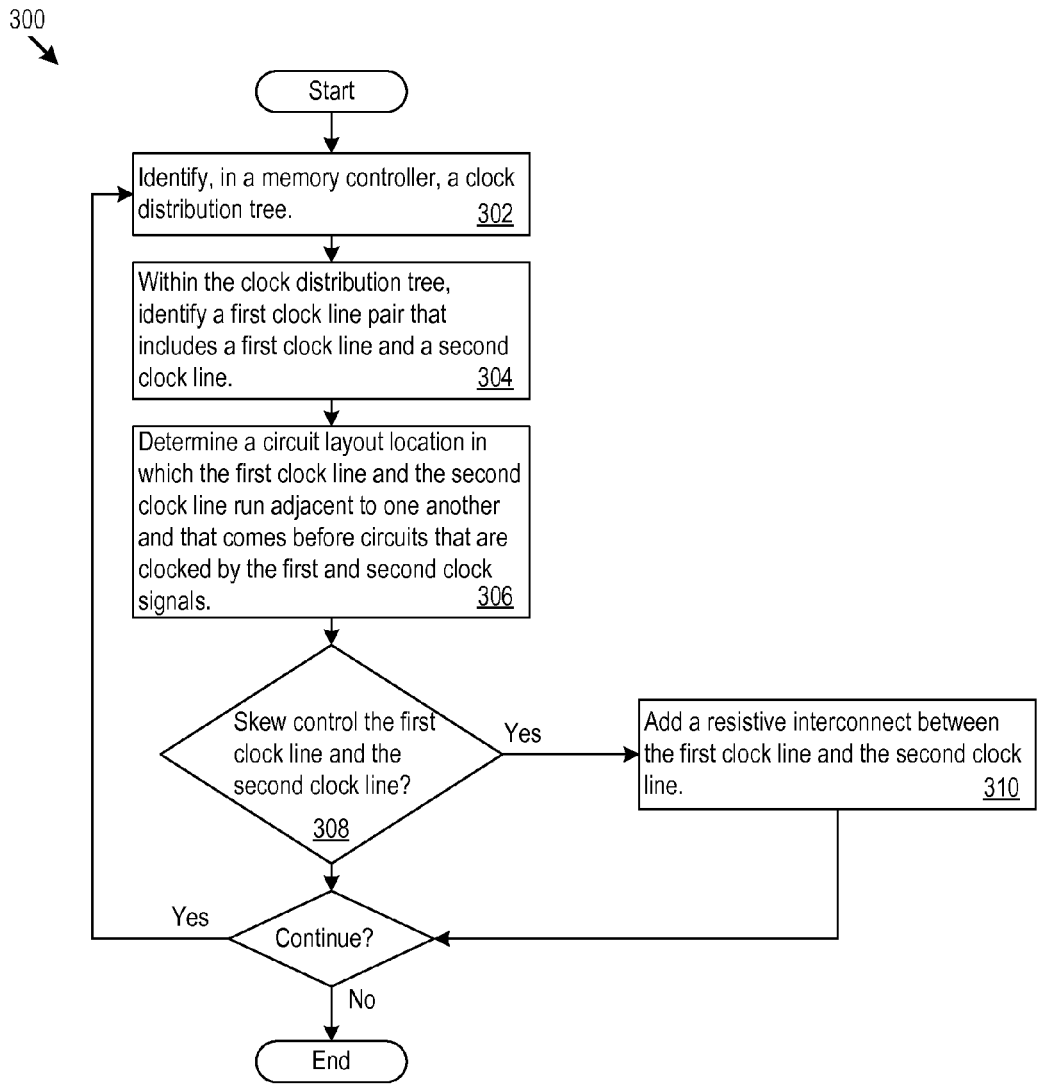
FIG. 3 is an example of a process for designing or fabricating a device with skew control.

FIG. 2 shows a specific example 200 of skew control, and FIG. 3 shows a design or fabrication process 300 that may be taken to provide the skew control. With regard to FIGS. 2 and 3, in the process or designing or fabricating a memory controller, the process may include identifying, in the memory controller 102, a clock distribution tree 106 (302). Within the clock distribution tree 106, the process may identify a first clock line pair 202 that includes a first clock line 204 that will carry a first clock signal, and a second clock line 206 that will carry a second clock signal (304).

In addition, the process 300 may determine a circuit layout location 208 in which the first clock line 204 and the second clock line run 206 adjacent to one another and that comes before circuits that are clocked by the first and second clock signals (306). The circuits may be registers, flip flops, buffers, processors, or any other logic. The process 300 determines that skew control will be applied to the first clock line 204 and the second clock line 206 (308). Accordingly, after determining to skew control the first clock line and the second clock line, the process 300 may add a resistive interconnect 210 between the first clock line 204 and the second clock line 206 (310). The process 300 may determine the signal lines to which to apply skew control by choosing signal lines that are expected to show the most signal skew, by choosing signal lines that control high speed processing operations, by choosing signal lines that clock important input/output buffers, or in other manners.

As many such resistive interconnects may be added as desired. Note that the resistive interconnects may be placed between multiple sets of signal line pairs. Accordingly, for example, the design and fabrication process may identify any additional clock line pairs in the clock distribution tree, that, with the first clock line pair, drive a complete set of signals having a common type in the memory controller. The design and fabrication process may add resistive interconnects between any or all of the additional clock line pairs.

The common type of signals may be, for example, all of the address signals outgoing from the memory controller 102 to the memory 104. As another example, the common type of signals may be all of the data signal outgoing from the memory controller 102 to the memory 104, or may be all of the data signals incoming from the memory 104 to the memory controller 102. In other words, the resistive interconnects may be made between adjacent clock lines that drive circuitry associated with sending address signals, sending data signals, receiving data signals, or any other incoming or outgoing signals. The circuitry may include any number of individual registers, flip flops, buffers, or other logic that are individually clocked by the clock lines.

The resistive interconnects may be added to an ASIC design file or schematic in the design phase, as examples. When the skew controlled device is actually created, the resistive interconnects may be fabricated as a metal or polysilicon trace, or other resistive connection.

As explained above, the resistive interconnects may be placed between adjacent signal lines. Doing so also tend to help reduce the overall worst case skew between any two signal lines in the memory controller, even for non-adjacent signal lines. In other implementations, resistive interconnects may be made between non-adjacent signal lines to skew control signal lines that do not necessarily run adjacent to one another at any given circuit location.

FIG. 2 shows a second example of a resistive interconnect 212. The resistive interconnect 212 connects two adjacent clock lines that drive flip flops, including the flip flop 118. A third example of a resistive interconnect 214 is also present. FIG. 2 shows the third example of the resistive interconnect 214 as a resistive and capacitive model for the interconnect. In addition, FIG. 2 shows several other examples of circuit layout locations 216, 218, 220 where signal lines run adjacent to one another. The model for the third interconnect 214 is described in more detail with regard to FIG. 4.

Figure 4:
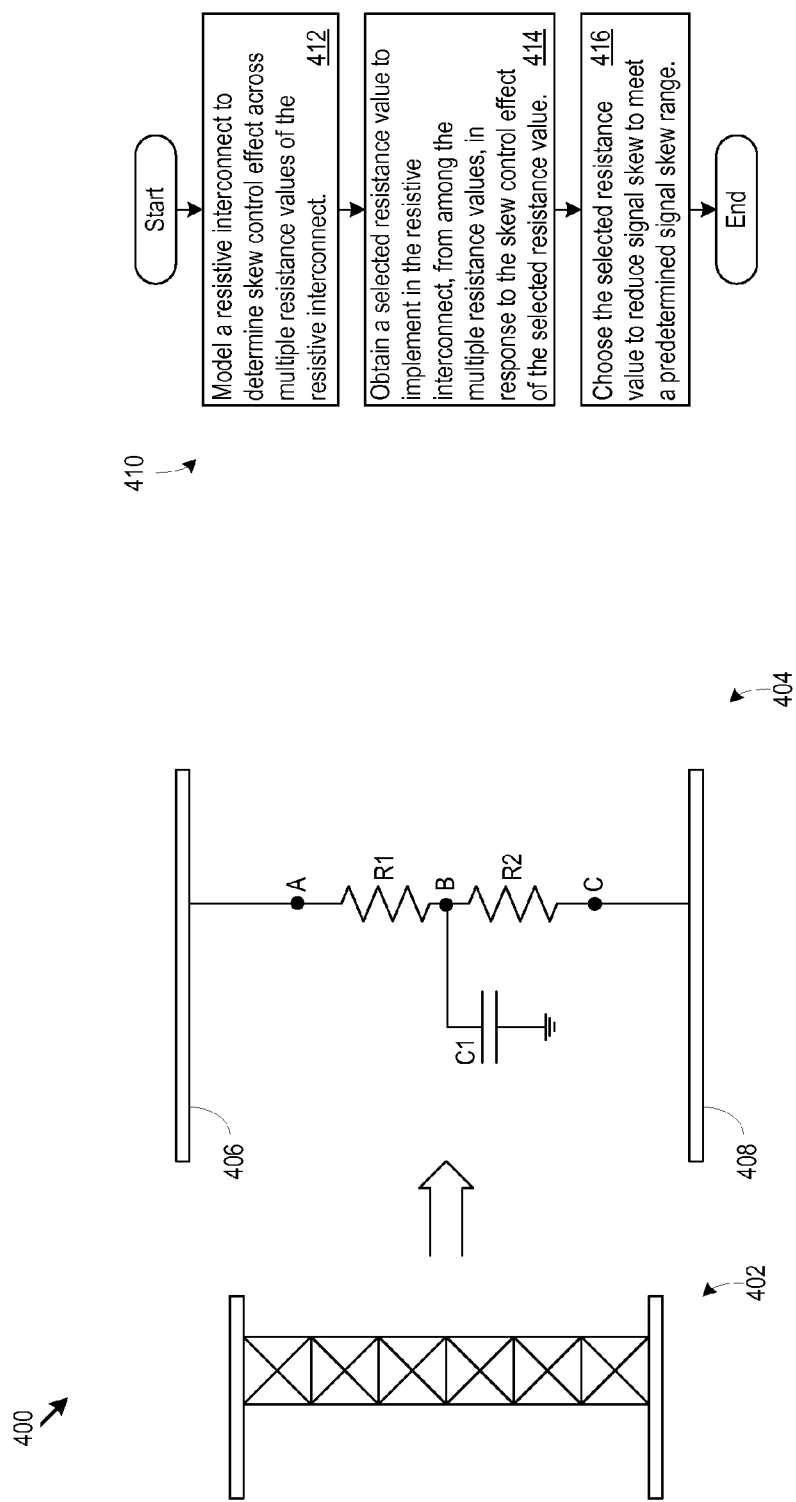
FIG. 4 is an example of modeling an interconnect between signal lines as a resistive and capacitive network.

FIG. 4 shows a modeling example 400 in which a resistive interconnect 402 is approximated by a resistive and capacitive model 404. In this example, the model 404 includes two series resistors R1 and R2, and a capacitor C1 between the resistors R1 and R2 to ground. The resistors connect the first signal line 406 and the second signal line 408. The nodes of the model 404 are labeled A, B, and C.

A circuit simulator such as SPICE may be used to model the effect of the resistive interconnect 402. A SPICE circuit for the model 404 is (with nodes A and C as endpoints):

| R1 | A | B | Rval |
|----|---|---|------|
| C1 | B | GND | Cval |
| R2 | B | C | Rval |

For a 30 micron length resistive interconnect, the Rval (i.e., resistance) may be estimated at 15 ohms, and Cval (i.e., capacitance) may be estimated at 6 femto Farads (FF). These values will vary according to the fabrication process. The simulation results in Table 1 below use an Rval of 30 ohms to generate a more conservative skew reduction estimate.

Table 1 shows the result of simulating the model 404 in SPICE. The resistive interconnects reduce signal skew dramatically. The signal skew is given by the standard deviation and range in Table 1 (in picoseconds, ps), where Range indicates the difference in time between the latest and earliest arriving signal on the two signal lines 406, 408. The Mean is given in nanoseconds, ns.

TABLE 1

| Rval (ohm) | Cval (FF) | Mean (ns) | Std dev (ps) | Range (ps) |
|------------|-----------|-----------|--------------|------------|
| infinity   | 0         | 0.126     | 47           | 144.8      |
| 15         | 6         | 0.135     | 0.7          | 2.4        |
| 120        | 48        | 0.232     | 8.8          | 25.2       |

In the first row, Rval represents the value of R1, and an Rval of infinity represents a device without any resistive interconnect between signal lines. With the resistive interconnect, the range in the skew decreases substantially.

Returning to FIG. 4, a modeling process 410 is also shown. The process 410 includes modeling the resistive interconnect 402 to determine skew control effect across multiple resistive values of the resistive interconnect 402 (412). The process 410 may model the resistive interconnect as a resistive and capacitive network, for example. The process 410 may obtain a selected resistance value to implement in the resistive interconnect 402, from among the multiple resistance values, in response to the skew control effect of the selected resistance value. The process 412 may choose the selected resistance value to reduce signal skew to meet a predetermined skew range (e.g., no greater than 5 ps) (416).

Any device may include skew control using the resistive interconnects. In such a device, for example, there may be driving logic (e.g., a memory controller 102) operable to drive multiple signal lines. The multiple signal lines comprise multiple pairs of signal lines that have been selected as skew controlled pairs of signal lines. In other words, one or more pairs of signals lines are specifically chosen for skew control and designated as skew controlled signal lines. Then, the device may include a resistive interconnect associated with any one or more of the multiple pairs of signal lines. The resistive interconnect couples together the signal lines in each of the multiple pairs of signal lines and helps to reduce skew between the signals carried on the signal lines.

While various embodiments of the systems and methods have been described, it will be apparent to those of ordinary skill in the art that many more embodiments and implementations are possible within the scope of the systems and methods. Accordingly, the systems and methods are not to be restricted except in light of the attached claims and their equivalents.

What is claimed is:

1. A method comprising:
    identifying a clock distribution tree, the clock distribution tree comprising a hierarchical clock signal distribution through multiple branching tree levels;
    within the clock distribution tree:
        identifying a first clock line pair at an identified tree level among the multiple branching tree levels, the first clock line pair comprising:
            a first clock line at the identified tree level that will carry a first clock signal; and
            a second clock line at the identified tree level that will carry a second clock signal;
    determining a circuit layout location:
        where the first clock line and the second clock line run adjacent to one another within the identified tree level; and
        that is prior to circuits clocked by the first and second clock signals;
    determining to skew control a second clock line pair;

after determining to skew control the first clock line and the second clock line with respect to one another, adding a resistive interconnect between the first clock line and the second clock line.

2. The method of claim 1, further comprising:
modeling the resistive interconnect to determine skew control effect across multiple resistive values of the resistive interconnect.

3. The method of claim 2, further comprising:
obtaining a selected resistive value to implement in the resistive interconnect, from among the multiple resistive values, in response to the skew control effect of the selected resistive value.

4. The method of claim 2, wherein modeling comprises:
modeling to reduce skew to meet a predetermined skew range.

5. The method of claim 4, wherein modeling further comprises:
modeling the resistive interconnect as a resistive and capacitive network.

6. The method of claim 1, wherein:
the circuits comprise separate registers individually clocked by the first and second clock lines.

7. The method of claim 1, wherein the first clock line pair is configured to drive a signal of a common functional type as the second clock line pair.

8. The method of claim 7, wherein:
the common functional type comprises address signals.

9. The method of claim 7, wherein:
the common functional type comprises data signals.

10. The method of claim 7, wherein:
the common functional type comprises memory controller data signals.

11. A method comprising:
identifying multiple signal lines in a clock tree, the clock tree configured to provide a hierarchical clock signal distribution to the multiple signal lines arranged into multiple branching tree levels;
among the multiple signal lines, determining to skew control a first pair of signal lines; and
based on the determination to skew control the first pair of signal lines, placing a resistive interconnect between the signal lines of a second pair of signal lines within a selected tree level among the multiple branching tree level, the second pair of signal lines and the first pair of signal lines carrying clock signals through the clock tree.

12. The method of claim 11, wherein identifying comprises:
identifying adjacent clock signal lines.

13. The method of claim 11, wherein placing comprises:
placing a resistive interconnect with an impedance selected to reduce signal skew between the signal lines of the second pair of signal lines to within a pre-specified skew range.

14. The method of claim 11, further comprising:
modeling the resistive interconnect to determine skew control effect across multiple resistive values of the resistive interconnect.

15. The method of claim 14, further comprising:
obtaining a selected resistive value to implement in the resistive interconnect, from among the multiple resistive values, in response to the skew control effect of the selected resistive value.

16. A system comprising:
a clock tree configured to provide a hierarchical clock signal distribution, the clock tree comprising multiple branching tree levels including:
a first pair of signal lines at a first identified tree level, the first pair of signal lines configured to drive clock signals; and
a second pair of signal lines at a second identified tree level, the second pair of signal lines also configured to drive clock signals;
driving circuitry configured to drive the first pair of signal lines; and
a skew control resistive interconnect deliberately placed at the first identified tree level after the driving circuitry to couple together the first pair of signal lines with an impedance operable to hold signal skew between the first pair of signal lines to within a specifically predetermined skew range chosen for the first pair of signal lines, the skew control resistive interconnect deliberately placed at the first identified tree level responsive to a determination to skew control the second pair of signal lines configured to drive the clock signals.

17. The system of claim 16, wherein the driving circuitry comprises a memory controller configured to drive the first pair of signal lines.

18. The system of claim 17, where the first pair of signal lines comprises a memory clock signal line.

19. The system of claim 16, where the first pair of signal lines comprise signal lines present at an identified level of the clock tree.

20. The system of claim 19, where the skew control resistive interconnect is deliberately placed at the identified level of the clock tree.

* * * * *

UNITED STATES PATENT AND TRADEMARK OFFICE
CERTIFICATE OF CORRECTION

PATENT NO. : 9,190,132 B2
APPLICATION NO. : 13/676482
DATED : November 17, 2015
INVENTOR(S) : Ganesh Swaminathan It is certified that error appears in the above-identified patent and that said Letters Patent is hereby corrected as shown below:

In the Claims

In column 4, claim 1, line 67, after "clock line pair;" insert --and--.

Signed and Sealed this
Fifteenth Day of March, 2016

Michelle K. Lee
*Director of the United States Patent and Trademark Office*